US012634620B2

(12) United States Patent
Anderson

(10) Patent No.: US 12,634,620 B2
(45) Date of Patent: May 19, 2026

(54) DIGITAL LAVALIER MICROPHONE

(71) Applicant: Sound Devices LLC, Reedsburg, WI (US)

(72) Inventor: Matthew G. Anderson, Madison, WI (US)

(73) Assignee: Sound Devices LLC, Reedsburg, WI (US)

( * ) Notice: Subject to any disclaimer, the term of this patent is extended or adjusted under 35 U.S.C. 154(b) by 220 days.

(21) Appl. No.: 18/478,634

(22) Filed: Sep. 29, 2023

(65) Prior Publication Data

US 2024/0114286 A1 Apr. 4, 2024

Related U.S. Application Data

(60) Provisional application No. 63/378,184, filed on Oct. 3, 2022.

(51) Int. Cl.
| | |
|---|---|
| *H04R 1/24* | (2006.01) |
| *H04R 1/04* | (2006.01) |
| *H04R 1/08* | (2006.01) |
| *H04R 3/00* | (2006.01) |
| *H04R 5/027* | (2006.01) |
| *H04R 19/04* | (2006.01) |

(Continued)

(52) U.S. Cl.
CPC .............. *H04R 1/245* (2013.01); *H04R 1/04* (2013.01); *H04R 1/083* (2013.01); *H04R 3/005* (2013.01); *H04R 5/027* (2013.01); *H04R 19/04* (2013.01); *H04S 1/007* (2013.01); *H03F 3/183* (2013.01); *H03F 2200/03* (2013.01); *H04R 2410/01* (2013.01); *H04R 2420/07* (2013.01); *H04S 2400/15* (2013.01)

(58) Field of Classification Search
CPC .......... H04R 1/245; H04R 1/04; H04R 1/083; H04R 3/005; H04R 3/027; H04R 19/04; H04R 2410/01; H04R 2420/07; H04S 1/007; H04S 2400/15; H03F 3/183; H03F 2200/03
USPC .............................................. 381/1, 91, 323
See application file for complete search history.

(56) References Cited

U.S. PATENT DOCUMENTS

| | | | |
|---|---|---|---|
| 6,111,966 | A | 8/2000 | Staat et al. |
| 8,280,078 | B2 | 10/2012 | Yoshino |
| 8,559,657 | B2 | 10/2013 | Akino |

(Continued)

FOREIGN PATENT DOCUMENTS

| | | |
|---|---|---|
| EP | 2115565 B1 | 8/2017 |

OTHER PUBLICATIONS

PCT/US2023/034251, International Preliminary Report on Patentability dated Apr. 17, 2025, 10 pages.

(Continued)

*Primary Examiner* — William A Jerez Lora
(74) *Attorney, Agent, or Firm* — Andrus Intellectual Property Law, LLP

(57) ABSTRACT

A lavalier microphone has improved dynamic range. The lavalier microphone incorporates a pair of microphone transducer elements into the same housing or attached housings, with one of the microphone transducer elements being more sensitive to acoustic input than the other. The voltage signals from the respective transducer elements are processed and combined, resulting in a digital output audio signal with improved signal to noise both at lower and higher input acoustic levels.

23 Claims, 6 Drawing Sheets

(51) Int. Cl.
   *H04S 1/00* (2006.01)
   *H03F 3/183* (2006.01)

(56) References Cited

U.S. PATENT DOCUMENTS

| | | | |
|---|---|---|---|
| 8,848,950 B2 | 9/2014 | Shimura | |
| 8,861,764 B2 | 10/2014 | Tanaka et al. | |
| 8,873,773 B2 | 10/2014 | Akino | |
| 9,167,354 B2 | 10/2015 | Nowak | |
| 9,407,996 B2 | 8/2016 | Haila et al. | |
| 9,654,134 B2 | 5/2017 | Popovich et al. | |
| 10,192,537 B2 | 1/2019 | Gauger, Jr. et al. | |
| 2005/0102048 A1 | 5/2005 | Anderson et al. | |
| 2008/0192962 A1 | 8/2008 | Halteren | |
| 2009/0226006 A1* | 9/2009 | Meyer | H04R 3/005 |
| | | | 381/94.1 |
| 2010/0111324 A1* | 5/2010 | Yeldener | H04R 1/406 |
| | | | 381/92 |
| 2011/0096945 A1 | 4/2011 | Furst et al. | |
| 2014/0254837 A1* | 9/2014 | Mortensen | H03F 3/68 |
| | | | 381/120 |
| 2015/0016225 A1* | 1/2015 | Steckel | G05D 1/0255 |
| | | | 367/99 |
| 2015/0078593 A1 | 3/2015 | Uchida | |
| 2015/0189445 A1* | 7/2015 | Haila | H04R 3/005 |
| | | | 381/114 |
| 2016/0173983 A1* | 6/2016 | Berthelsen | H04R 3/007 |
| | | | 381/55 |
| 2017/0295419 A1 | 10/2017 | Poulsen et al. | |
| 2018/0069691 A1* | 3/2018 | Sienko | H04L 7/0087 |
| 2021/0266717 A1 | 8/2021 | Mendlowits | |
| 2022/0030360 A1 | 1/2022 | Nowak | |
| 2023/0421702 A1* | 12/2023 | Cutler | H04M 3/568 |

OTHER PUBLICATIONS

PCT/US2023/034251, International Search Report and Written Opinion dated Dec. 26, 2023, 12 pages.
Wichern et al., "Removing lavalier microphone rustle with recurrent neural networks", 21st International Conference on Digital Audio Effects, Portugal, 2018; retrieved on Dec. 18, 2023 from https://dafx.de/paper-archive/2018/papers/DAFx2018_paper_45.pdf.

* cited by examiner

DIGITAL LAVALIER MICROPHONE

CROSS-REFERENCE TO RELATED APPLICATION

The present application claims priority of U.S. Provisional Patent Application No. 63/378,184, filed Oct. 3, 2022, the content of which is incorporated herein by reference in its entirety.

SUMMARY

The disclosed invention provides means to improve the signal to noise properties associated with a very small portable microphone unit. It does so by incorporating two or more microphone transducer elements into the same housing or into attached enclosures and provides improved signal to noise performance for the output both at lower and higher input acoustic levels.

BACKGROUND

Lavalier microphone systems have become increasingly popular due to the convenience and flexibility offered by their small size and low weight design. They are especially important for film and television production, where the presence of a visible (large) microphone may be distracting and is most often strongly considered as an aesthetically undesirable element to have visible within a scene. Lavalier microphones allow performers on a stage or in a movie set substantial freedom for active movement while engaged in performances. They are typically mounted on performer or attached to their clothing, costumes, behind their ties or even hidden in their hair. In order to operate, lavalier microphones must provide a sufficient dynamic range to accommodate acoustic sound levels without introducing undesirable artifacts such as saturation or distortion. For example, the acoustic waveform levels that producers need to record may range from whispering to gunshots. Henceforth, the stage and/or scene where performers are to be recorded and often filmed will be collectively referred to as an audio recording environment.

For some lavalier microphones, a miniaturized microphone capsule may be contained in a portable housing along with some supporting electronics. Often, these may include a set of common source FET amplifiers (oftentimes referred to as impedance converters) to provide an input impedance compatible with that from the electrical output from the microphone capsules, along with amplifying their signal amplitudes. Often, a common drain (as opposed to a common source) configuration for these FET amplifiers may prove suitable. Unfortunately, semiconductor physics results in an output noise contribution, sometimes referred to as thermal noise. This source of this noise is presumed to result from the thermal agitation of charge carriers (electrons) within a conductor. As one skilled in the art can appreciate, thermal noise is detrimental to the resultant signal to noise ratio (SNR) of the available output signal. In the prior art, attempts have been made to optimize the tradeoff between the available dynamic range, microphone diaphragm size (with larger sizes allowing higher output voltage ranges) relative to (shot) noise levels. However, previous attempts in microphone design have not yielded the desired sensitivity to low audio levels, while at the same time, providing the robustness required to operate in the presence of high audio levels with an overall acceptable SNR.

SUMMARY OF THE INVENTION

Within the context of the invention, multiple (at least two) microphone transducers with each having its own amplifier (s) are built into a common housing (or attached housings) with supporting electronics to provide digital output signals derived from amplified versions of analog voltage signals from the two (or more) microphone transducers. One microphone transducer has lower acoustic sensitivity, and the other microphone transducer has higher acoustic sensitivity. For example, if two condenser-type microphone transducers are used, the diaphragm of one of the transducers is larger than the diaphragm of the other transducer. Both microphone transducers are placed for exposure to identical or nearly identical acoustic energy. The electronics operate to judiciously combine the digital output signals derived from each of the microphone transducers such that a high SNR is maintained, but without allowing distortion artifacts from the more sensitive transducer to affect the output when acoustic signals levels are high enough to cause them. In this manner, the best output of each microphone transducer is used and the resultant output signal exhibits higher dynamic range than either microphone transducer on its own. Human auditory noise masking makes it impossible for a human being to hear the difference between this arrangement and a larger-diaphragm condenser microphone.

The processing power needed to accurately combine the signals from each microphone transducer without artifacts is a significant concern with wired lavalier microphones. One aspect of the invention concerns allocating processing and power requirements between an internal digital processor in the lavalier microphone housing and external digital processors in components downstream such as a wireless RF transmitter, RF receiver, mixer, recorder, etc. When a wired lavalier microphone is worn by a performer, the cord from the microphone housing may have a 3.5 mm audio jack serving as a connector that is plugged into a body pack RF wireless transmitter. In one exemplary embodiment of the invention, the digital output signals from the microphone transducers are converted in the internal digital processor within the microphone housing to a stereo serial data SPDIF (Sony Philips Digital Interface Format) stream that is transmitted over the connecting cord to be subsequently combined by an external digital processor to generate a digital audio output signal. The digital audio output signal can then be recorded, broadcast, mixed with other audio sources and/or played back to listeners via headphone or loudspeaker arrangement. Within the lavalier microphone housing are the two microphone transducers, a pair of ADCs or a stereo ADC, signal conditioning (op amps), and an internal digital processor, such as an FPGA, to convert $I^2S$ output of the ADC channels into a stereo PCM signal (e.g., SPDIF) which can be easily transmitted over the cord to the body pack transmitter. Additionally, all of the electronics within the microphone housing are powered via DC voltage, which is desirably provided over the cord from the body pack transmitter back up to components in the microphone housing that regulate and distribute power and voltage to the various components in the housing. More specifically, the microphone may have a cord with a conductor that transmits a clock signal (WCLK) superimposed on underlying DC power. A capacitor in the microphone housing operates to separate the clock signal from the underlying DC power transmitted over the conductor in the cord. The clock signal is provided to the internal digital processor and is used to coordinate operation of the ADCs and also the synchronization of the serial SPDIF data output. The underlying DC power may be provided to a linear regulator also located in the microphone housing, which in turn regulates and distributes DC power to the internal digital processor, the amplifiers, and the ADCs. The linear regulator (and possibly a separate boost converter) provides biasing voltage to microphone transducer elements.

An additional aspect of the invention is that the internal processor makes time and/or phase adjustments of the two signals to align each signal for better combining. Also, each microphone transducer can be equalized by digital processing to make sure each transducer sounds identical. In one exemplary embodiment, combining of the digital signals is accomplished with a process similar to the process disclosed in U.S. Pat. No. 9,654,134 B2, entitled "High Dynamic Range Analog-to-Digital Conversion with Selective Regression based Data Repair," by Popovich et al., issuing on May 16, 2017 and assigned to the Assignee of this application, incorporated herein by reference. Those skilled in the art will appreciate that other suitable signal combining processes may be used.

It may be desirable in some systems to combine the signals within the microphone housing on the internal digital processor, e.g., an internal FPGA. Whether signal combining occurs on an internal digital processor, or an external digital processor, the cord from the housing passes digital signals, which are much more immune to electromagnetic noise as compared to a typical unbalanced analog signal which is normally used for lavalier microphones. This is especially critical with wireless RF transmitters, where the transmitter itself typically imparts a degree of noise onto the microphone cord, which is often deleterious to the sound quality from the microphone.

It may be desirable to use an acoustical attenuator at the input port of the low sensitivity microphone transducer such that the relative amount of gain between the two microphone transducers can be adjusted physically by the user or a technician.

Additionally, at manufacture, each microphone transducer can be acoustically tested and characterized. The frequency and or phase characteristics can be stored by a set of coefficients within memory inside of the microphone housing. The coefficients can later be read by the processor and used to obtain better sound quality from the microphone system.

The housing may also optionally contain a USB port for accessing, maintaining, or updating the supporting electronics. For example, it is preferred that the code running on the internal FPGA be able to be remotely updated via the USB port and a standard UART interface which some FPGAs have built-in expressly for code update.

Aspects of the invention can also be implemented in a wireless microphone such a wireless lavalier microphone. A wireless lavalier microphone constructed in accordance with the invention is similar to the other embodiments having multiple (e.g., two) microphone transducers located coincidentally within a common housing, but uses a rechargeable battery as a power source, and communicates digital data wirelessly over an antenna. The wireless lavalier microphone transmits data to a wireless body pack RF transmitter, e.g. using Bluetooth pairing technology or a proprietary signaling technology such as an 8-PSK with a circular constellation for 3 bits at a time in the IQ plane. Alternatively, the wireless lavalier microphone can transmit data to other equipment in the audio system such as directly to a wireless audio receiver. Although digital signal combination can be implemented on an external digital processor when using a wireless microphone, implementing signal combination on the internal digital processor in a wireless microphone system reduces the amount of digital data that needs to be transmitted and is therefore preferred as it preserves power and bandwidth.

In some embodiments, the microphone modules themselves will encode audio waveform data to reduce bandwidth requirements. In these cases, the step of decoding the data for the actual audio waveform (e.g., audio PCM data) may be performed at each receiver module, the mixer/recorder module or at a later time if this data is to be recorded.

BRIEF DESCRIPTION OF THE DRAWINGS

A more complete understanding of the present invention and the attendant advantages and features thereof will be more readily understood by reference to the following detailed description when considered in conjunction with the accompanying drawings.

DETAILED DESCRIPTION—BACKGROUND OF THE INVENTION

Figure 1:
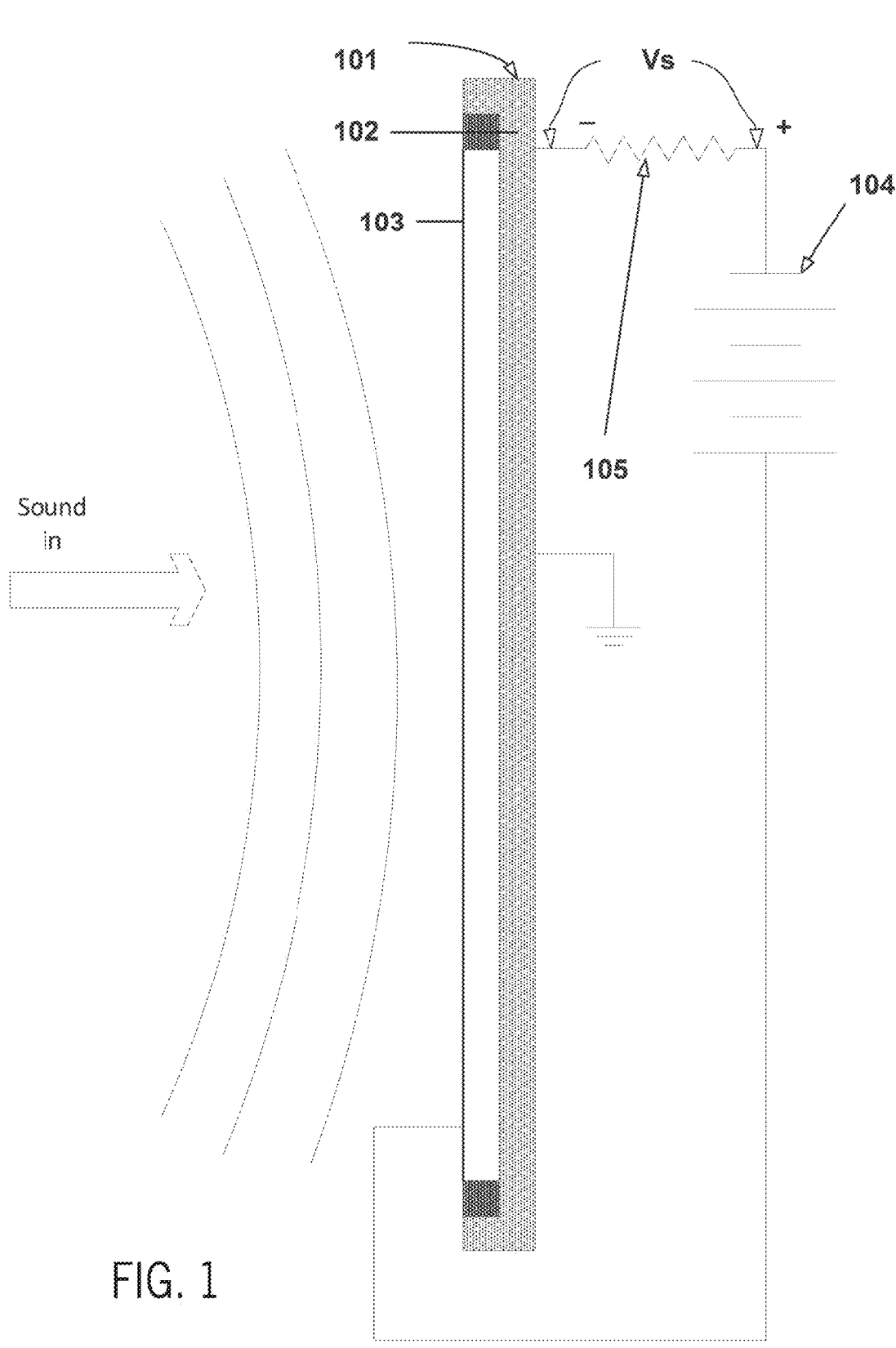
FIG. 1 is a simplified diagram showing a simplified cross-sectional view for the construction of a condenser microphone element as known in the prior-art.

FIG. 1 illustrates a simplified cross-sectional view for the construction of a condenser-type microphone transducer element 100 as is known in art. The microphone transducer element 100 depends on a time-varying capacitance between a grounded conductive back plate 101 (often made from machined brass) and a diaphragm 103 stretched out over the face of the back plate 101. The diaphragm 103 is often made of a thin sheet of light-weight Mylar that has a metal coating applied to it so that it has a conductive surface. An exemplary diameter of the diaphragm is 5 mm. The spacing between the diaphragm 103 and back plate 101 may be maintained by an annular insulating spacer 102 mounted between them. The capacitance between the diaphragm 103 and back plate 101 is a function of their surface area and the distance (gap) between them. When sound waves impinge upon the face of the diaphragm 103, pressure variations cause mechanical movement of the diaphragm 103 in relation (toward or away) to the back plate 101. Accordingly, capacitance will vary depending on fluctuations in pressure due to the presence of sound waves. If a bias voltage 104 (typically in the range of 11 to 52V) and a resistor 105 are connected in series across this (varying) capacitance, charge will be exchanged across the series resistor 105 due to the fixed voltage and changing capacitance. The voltage measured across the resistor 105 will develop an AC component in dependence on the time-varying capacitance. This voltage (labelled $V_S$ in FIG. 1) may be sensed and used to characterize fluctuations in the sound pressure level due to variations in pressure due to sound at the location of the condenser element 100.

Figure 2:
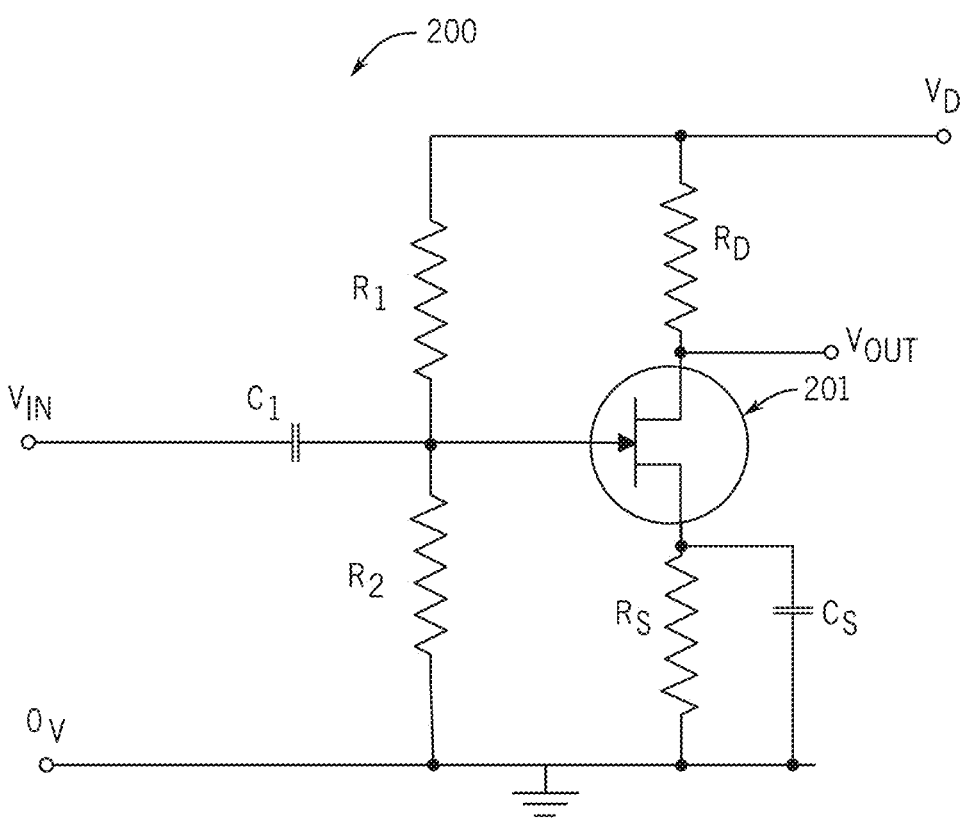
FIG. 2 is a basic circuit diagram for a common source junction field-effect transistor (JFET) amplifier suitable for interfacing to and amplifying the electrical output from a condenser microphone element, as known in the prior-art.

In order to apply the voltage, $V_S$ as the input to a microphone preamplifier, an impendence converter 200 may be constructed using a junction field-effect transistor (JFET) 201 as shown in FIG. 2. As is well known in the art, JFET's have an extremely high input impedance and a low noise output making them well suited for amplifying low voltage input sources. If the input terminal, labelled $V_{in}$, is connected to the signal voltage (labelled $V_S$ in FIG. 1), the output of the JFET 201 amplifier (labelled as $V_{out}$ in the FIG. 2) provides an amplified version of the input signal having an impedance that is low enough to be suitable for connection to a subsequent microphone pre-amp circuit. The symbol $V_D$ in FIG. 2 represents supply voltage from a power supply, e.g., 5VDC.

Figure 3:
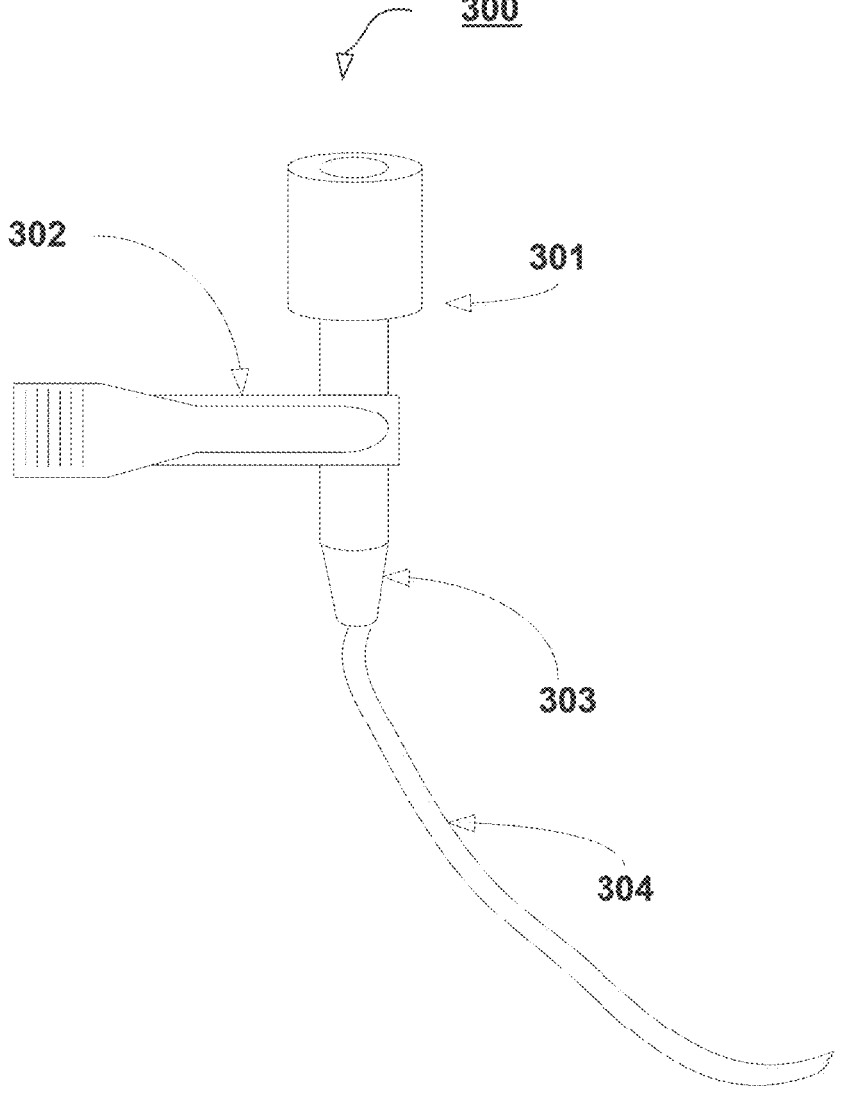
FIG. 3 is a drawing for an external view of a lavalier type microphone (and clip) that may contain a condenser type microphone element, as known in the prior art.

In the prior art, the microphone transducer element 100 and impedance converter 200 may be constructed and packaged into a microphone enclosure 301 as part of a lavalier microphone assembly 300, as externally pictured in FIG. 3. This prior art assembly is preferably built to be as small and lightweight as possible. The enclosure 301 also contains electronics for conditioning and/or formatting audio data to facilitate transmission over a connected cord 304, which will usually have a 3.5 mm connector. Wireless lavalier microphones are also known in the art. As shown in FIG. 3, lavalier microphones normally have a lavalier clip 302 that provides for easy mounting to the clothing on other parts of a performer. For wired microphone versions, the lavalier cord 304 may protrude from the assembly 300 through a rubber grommet 303 mounted at the bottom of the assembly.

If batteries or remote power are provided, a wireless version for this assembly 300 may be constructed that has no need to include either a cord 304 or grommet 303. Instead of a cable 304, a small antenna may protrude from the assembly at the bottom to provide communication. Alternatively, a short wire may connect the assembly to a portable transmitter/power pack, also worn by the user, that would transmit audio data to a paired wireless microphone receiver located somewhere nearby in the audio recording environment. Wireless embodiments provide the advantage of being easier to conceal and eliminate the need for performers to have any concern with regards to the position (entanglement) of any cords 304.

Referring again to FIG. 1, designers are faced with some tradeoffs when designing a condenser microphone element 100. Namely, as the size of the diaphragm 103 is increased, so does the sensitivity of the condenser element. In other words, for a given sound level (or SPL), a higher voltage ($V_S$ or Vin) is available to the JFET amplifier 201 than would be the case if a smaller diaphragm 103 was used. Unfortunately, this design choice may cause problems at higher sound levels such as saturation or overloading of the pre-amp. In contrast, designers may opt for a smaller diaphragm 103 for audio recording environments when high sound levels are expected, but this is at the expense of losing sensitivity to lower sound levels that are often an important part of the audio recording environment.

Past attempts to mitigate these tradeoffs have included the use of multiple microphones having different acoustic sensitivities. It should be appreciated that having multiple microphones can create confusion (and clutter) with respect to properly managing an audio recording environment. At this time, there is a substantial commercial interest for a microphone that can both provide high sensitivity, while that at the same time provide an improved SNR and ability to function properly at high sound levels.

DETAILED DESCRIPTION OF THE INVENTION

Figure 4:
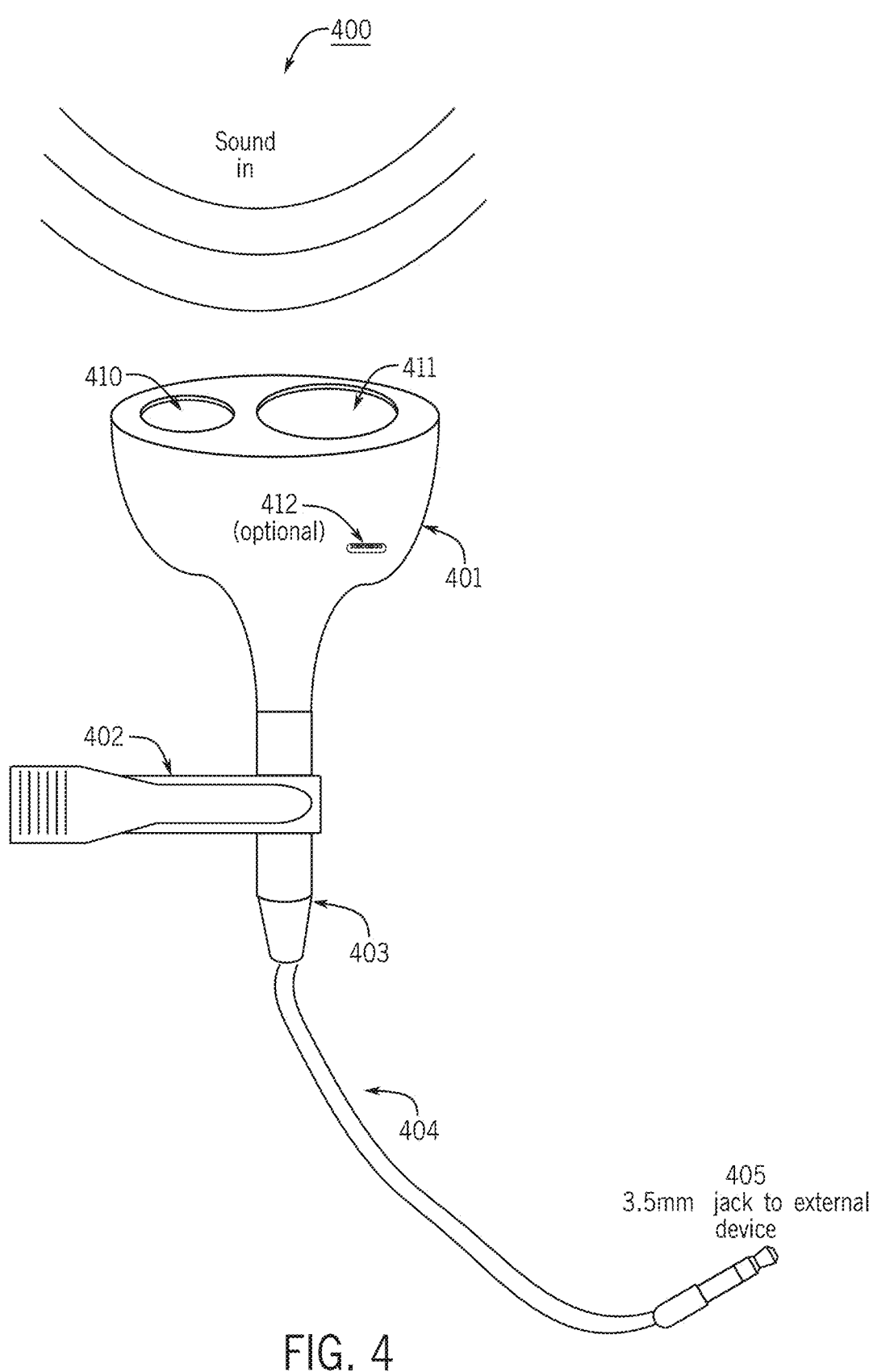
FIG. 4 is a drawing of a lavalier type microphone (and clip) that may contain a multiple (two) condenser type microphone elements according to an exemplary embodiment of this invention.

In surmounting the difficulties described above, the invention combines the advantages of multiple condenser microphone elements having different diaphragm sizes into an integrated and portable package that may be worn by performers while active (and moving) within an audio recording environment. FIG. 4 provides an external view for a lavalier type microphone 400 that has been constructed according to an exemplary embodiment of the invention. As can be seen in this drawing, a microphone housing 401 includes two (or more) microphone condenser elements 410 and 411 for detection of audio waveforms, where one of the condenser elements 411 is constructed with a larger diaphragm for improved sensitivity (compared to the other element 410). The condensers elements 410, 411 are placed coincidentally in the example shown in FIG. 4 for exposure to nearly identical acoustic energy.

Figure 5:
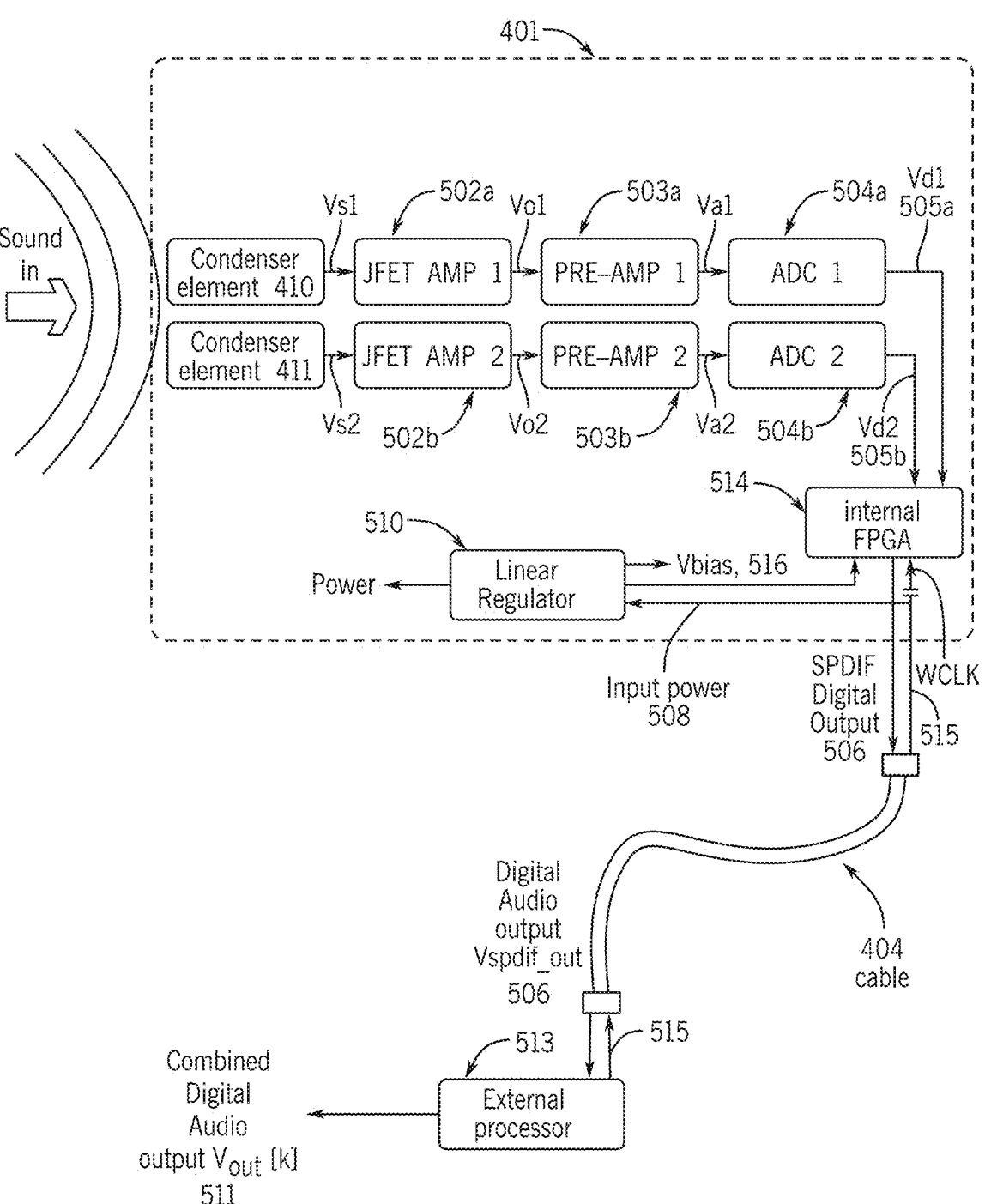
FIG. 5 provides a block diagram describing the internal electronics for a dual condenser microphone according to an exemplary embodiment of this disclosure.

FIG. 5 is a high-level block diagram illustrating an exemplary embodiment of the internal electronics (and interconnections) in a lavalier microphone 400 having two condenser microphone elements 410, 411. In other words, FIG. 5 shows components that are internal to the housing 401 shown in FIG. 4, and some exemplary components external to the housing 401. Although the case for two microphone condenser elements 410, 411 is described here, it should be apparent to one skilled in the art that a larger number of condenser elements can be used, and such embodiments are anticipated in the spirit of this disclosure. In addition, the invention can be implemented using types of microphone transducers other than condenser-type transducers as described in FIG. 1, such as dynamic or ribbon transducers, or a combination of different types. Referring to FIG. 5 and FIG. 4, incoming sound waves impinge on condenser microphone elements 410 and 411. One of the condenser elements will have a higher sensitivity than the other. In this example, condenser element 411 has a higher sensitivity to the incoming sound waves and produces an output voltage $V_{s2}$ indicative of the incoming sound pressure wave, but with a higher voltage $V_{s1}$ than is produced by condenser element 410. Multiple methods to provide a higher sensitivity to condenser element 411 (compared to 410) are envisioned in this disclosure. These include (without being limited to): providing condenser element 411 with a larger diaphragm or in other embodiments, having a similar diaphragm, but providing condenser element 411 with a higher bias voltage, designing the JFET amplifier 502b with a higher gain (compared with JFET amplifier 502a) or placing a passive acoustic attenuator over the opening to condenser element 410.

Preferably, the microphone housing 401 is constructed such that the two condenser elements 410 and 411 are mounted in very close proximity to each other. Provided that a similar sound wave approaches both condenser elements, both of the elements 410 and 411 should produce output voltages that are substantially similar (although of differing amplitude). The first microphone transducer and the second microphone transducer are preferably placed coincidently to ensure that they are exposed to nearly identical acoustic energy. This occurs if the distance between the center of a diaphragm of the first microphone transducer and the center of a diaphragm of the second microphone transducer is not greater than 1.7 cm, since under these circumstances both transducers with be located within a fraction of the smallest wavelength detectable by the human ear (e.g., 20 kHz).

The output of condenser element 410 (labelled as $V_{s1}$) and that for condenser element 411 (labelled as $V_{s2}$) serve as the inputs to a pair of JFET amplifiers 502a and 502b, respectively. Each of the JFET amplifiers, 502a and 502b, produces a lower impedance amplified output (labelled as $V_{o1}$ and $V_{o2}$, respectively). These analog outputs $V_{o1}$ and $V_{o2}$ are supplied as the input to a set of microphone pre-amps (503a and 503b, respectively), to produce a set of analog output signals (labelled as $V_{a1}$ and $V_{a2}$, respectively), having an amplitude that is suitable to supply as the input to a set of analog-to-digital converters (ADCs), (504a and 504b, respectively). Each ADC (504a and 504b) produces an output digital PCM signal ($V_{d1}$ and $V_{d2}$, respectively), representing the digital amplitude for each input ($V_{a1}$ and $V_{a2}$, respectively), taken at discrete sampling intervals over time. In some embodiments, these digital output signals may contain a binary resolution of 24 bits (23-bit mantissa and sign bit) where this output is transmitted using, e.g., an $I_2S$ serial format. In other embodiments, these values may be encoded as a binary encoded decimal number. In others, the number of bits may be set to other values and may be characterized by a 32-bit floating point digital value (such as IEEE 754 coding where each value has a 23 bit mantissa, sign bit and 8 bit exponent). Accordingly, the combination of the JFET amplifier 502a, the pre-amp 503a and the ADC 504a constitute means for amplifying and digitizing the first voltage signal $V_{s1}$ to generate a first digital signal $V_{d1}$. The combination of the JFET amplifier 502b, the pre-amp 503b and the ADC 504b constitute means for amplifying and digitizing the second voltage signal $V_{s2}$ to generate a second digital signal $V_{d2}$.

Referring now to FIG. 4 that illustrates an external view for a dual condenser element microphone 400 according to an exemplary embodiment of this invention, two microphone elements 410 and 411 are mounted such that they are physically spaced close together (a few mm or less) at the end of a microphone housing 401. In many audio recording environments, a substantial similarity should exist between their output signals ($V_{s1}$ and $V_{s1}$ in FIG. 5). For nominal audio signal levels, the operation of the JFET amplifiers 502a and 502b, and pre-amp circuits, 503a and 503b will be restricted to remain within their linear ranges. Therefore, the similarities (linear relationship) between the condenser output signals ($V_{s1}$ and $V_{s1}$) will be extended to the pre-amp outputs ($V_{a1}$ and $V_{a2}$) and assuming the ADCs also behave in a linear fashion, this similarity will also extend to their digital outputs ($V_{d1}$ and $V_{d2}$).

However, in some audio recording environments, this relationship (of similarity) between ($V_{s1}$ and $V_{s1}$) may break down. For example, referring to FIG. 5 again, when audio levels are very high, the more sensitive (larger) condenser element 411 may partially saturate, along with its connected JFET amplifier 502a. On the other hand, when audio levels are relatively low, the more sensitive condenser element 411 will provide a higher amplitude (still linear) signal to its JFET amplifier 502a (which will also remain linear). The less sensitive element 410 will also provide a (linear) signal to its JFET amplifier 502b. Since the noise contributions from each JFET amplifier 502a and 502b are similar, the resultant SNR for the high sensitivity digital output $V_{d2}$ 505a will surpass that of the other (low sensitivity), $V_{d1}$ 505b. This is in contrast to when the values for $V_{d1}$ 505a are saturating (due to high audio levels), the low sensitivity output $V_{d2}$ will possess superior SNR levels compared to $V_{d1}$ 505a. At this point, whether at high or low levels, at least one of the two digital outputs, $V_{d1}$ and $V_{d2}$ (505a and 505b) contains the information required to construct a high-fidelity representation for the input audio waveform. Combining these provides an opportunity to produce a digital output providing an improved SNR over a wider dynamic range of audio input levels than would be possible only using a single condenser element (along with its subsequent amplifier and ADC stages). The invention accomplishes this by judiciously combining the two digital output signals into a single digital audio output signal, 511 $V_{out}$ (see FIG. 5) depending on the audio input levels that exist at the condenser element pair, 410 and 411. In other words, the digital output 511, $V_{out}$ is constructed such that it primarily depends on the low sensitivity output $V_{d2}$ 505b when audio levels are high and in contrast it primarily depends on the high sensitivity output $V_{d1}$ 505a for lower audio levels. As can be seen in FIG. 5, an internal digital processor 514, e.g., a field programmable gate array (FPGA) 514 or an ASIC, is used to convert the two digital outputs $V_{d1}$ and $V_{d2}$ (505a and 505b) into a multichannel (in this example, 2-channel) SPDIF digital output signal 506 suitable for transmission out through the microphone cable 404 for further processing at another location.

This same digital processor 514 may be connected to a micro-USB access port 412 (see FIG. 4) which provides users with an external interface to access or update firmware operating on any component within the microphone housing 401. In a commercial product, the USB port 412 could be considered as an option made available only to the most advanced users who possess specialized knowledge and/or training relating to programming and/or accessing features of the internal firmware. This access port 412 may also serve as an aid to developers and/or engineers who are tasked with the update and maintenance of any firmware located in the microphone housing 401.

According to the exemplary embodiment in FIG. 5, the internal digital processor (e.g. internal FPGA) 514 is only required to convert the format for the ADC outputs 505a and 505b from an $I^2S$ serial format to a stereo SPDIF format signal 506. Any required further processing may be performed, e.g., by an external processor 513, such as external FPGA or digital signal processor, that receives the SPDIF digital output 506. In many embodiments, the external processor 513 may be built into another piece of equipment located downstream from the lavalier microphone unit 400, such as in a body pack RF transmitter, or even a receiver paired to the transmitter, a mixer recorder or other downstream audio equipment. An advantage of this approach is that it may not be practical to supply enough power to components in the microphone housing 401 if the internal digital processor requires significant energy.

As depicted in FIG. 5, an internal power regulator 510, e.g., a linear regulator 510, may be used to provide power for electronics located within the microphone housing 401. An incoming conductor 515 in cable 404 may provide a clock timing signal (WCLK) to the internal processor 514 that is derived from the external processor 513. The internal digital processor/FPGA 514 may use this incoming clock signal (WCLK) as a means to time and maintain the synchronization of the two ADCs 505a and 505b. It is also important for synching the data transmission over the cord 404 between the internal digital processor 14 and the external digital processor 513. As indicated in FIG. 5, it is preferable to supply the linear regulator 510 with incoming DC power 508 derived from an external power supply connected to conductor 515 in cable 404. Desirably, the DC power and word clock (WCLK) signals are superimposed (voltages) over each other on the same physical line 515. A capacitor is shown in line 515, which is used to separate the incoming clock signal (WCLK) from the baseline DC power being transmitted on line 515. The DC power supplied to the linear regulator may for example be 100 mW, 5VDC, 20 mA. The linear regulator 510 provides power DC power, for example 3.5VDC or 5VD to the internal digital processor 514 and the JFET amplifiers, the pre-amplifiers and the ADC converters. It also desirably includes or feeds a boost converter to provide the bias voltage for the condenser elements 410, 411. Accordingly, the conductor 515, the capacitor separating out the WCLK signal, and the linear regulator 510 as described constitute means for providing DC power to the internal digital processor 514, the first and second microphone transducers 410,411, the amplifiers 502a, 502b, 503a, 503b and the ADCs 504a, 504b.

In some embodiments, it may be preferable to wirelessly transmit the SPDIF output 506 to a nearby wireless receiver that supplies this data as needed for further processing. In these cases, an internal power supply, such as batteries, may also need to be included within the microphone housing 401.

Since the condenser element 411 has a larger diaphragm than that for condenser element 410, subtle differences in mechanical behavior may cause these elements to produce dissimilar outputs ($V_{s1}$ and $V_{s1}$). Although these should still have a linear relationship to each other, for nominal input sound levels, a different phase relationship may nonetheless remain between them. In some embodiments, a factory calibration (or measurement) may be performed to quantify any difference in phase, as measured at the outputs 505a and 505b. Based on these measurements, the internal FPGA 514 could apply linear filtering to either of these signals 505a and/or 505b to compensate or realign the phase relationship between them. In a similar capacity, these operations could also be later performed by the external FPGA, 513 if preferred.

The preferred process for optimally combining the two digital outputs, $V_{d1}$ and $V_{d2}$ is similar to the process disclosed in U.S. Pat. No. 9,654,134 B2, entitled "High Dynamic Range Analog-to-Digital Conversion with Selective Regression based Data Repair," by Popovich et al., issuing on May 16, 2017 and assigned to the Assignee of this application, incorporated herein by reference. To better understand implementation of aspects of the method described U.S. Pat. No. 9,654,134 B2 in the context of the present invention, it is important to understand that the low-gain ADC input labelled as 151 or $s_1[k]$ in FIG. 1 of U.S. Pat. No. 9,654,134 B2 is supplied, in the context of the present invention, the digital output signal 505a labeled as $V_{d1}$ in FIG. 6 of this disclosure. In a similar capacity, the mid-gain ADC input labelled as 152 or $s_2[k]$ in FIG. 1 of U.S. Pat. No. 9,654,134 B2 is supplied the digital output 505b (labeled as $V_{d2}$ in FIG. 5 of this disclosure.

Figure 6:
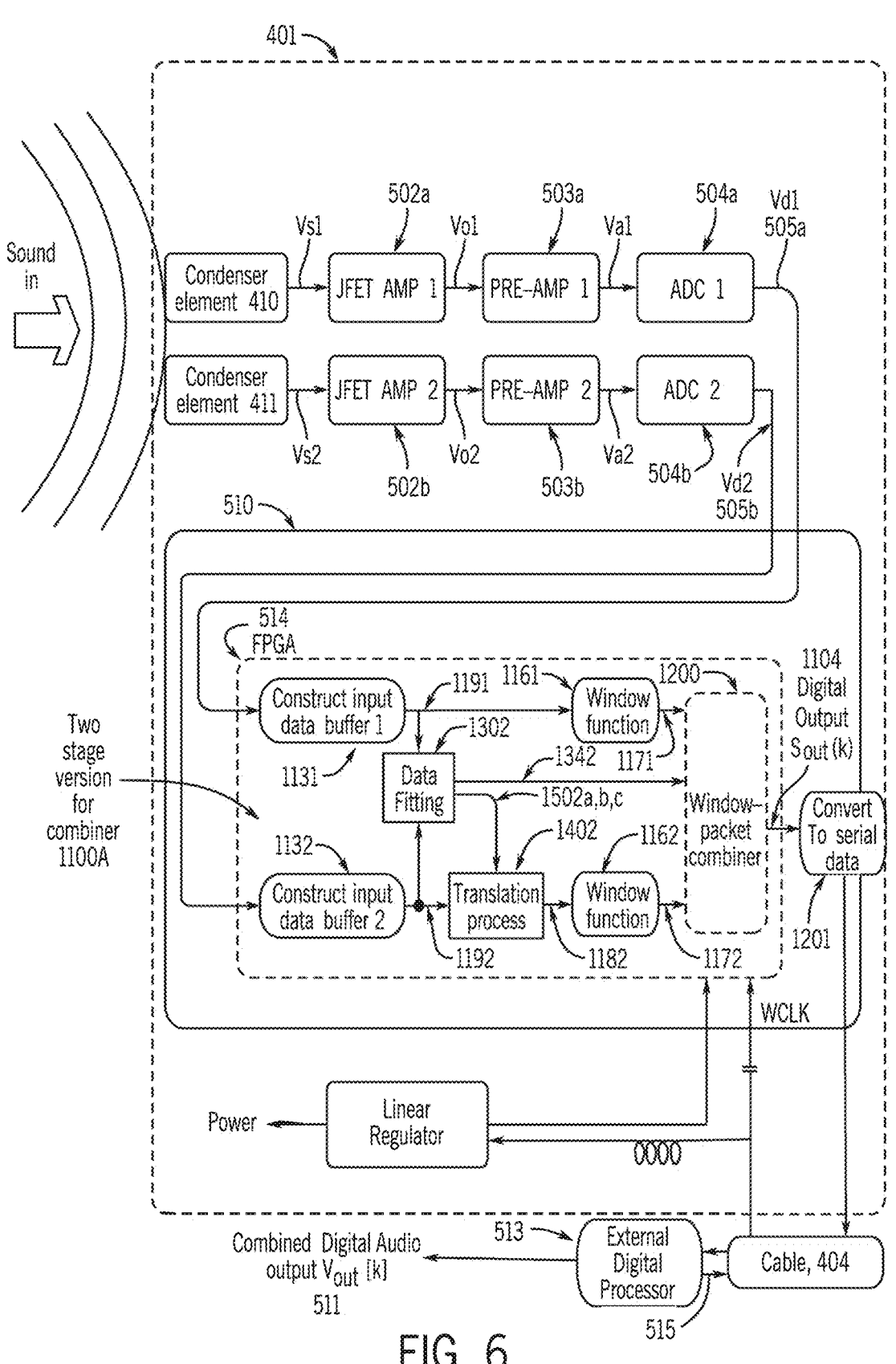
FIG. 6 illustrates how the outputs from a dual condenser microphone as described in FIG. 5 may be combined to form a single digital audio output by integrating this invention with a 2-channel version of the invention described in U.S. Pat. No. 9,654,134 B2 according to an exemplary embodiment.

FIG. 6 describes an exemplary two channel (dual condenser element) version of the present invention with a signal combiner 1100A similar to that described in the incorporated Popovich et al. U.S. Pat. No. 9,654,134 B2. In FIG. 6, the two-channel signal combiner 1100A is implemented on the internal FPGA 514 contained within the microphone housing 401. As discussed previously, it may be desirable, especially with lavalier microphones, to implement signal combination on an external digital processor 513 in order to conserve power and processing requirements within the microphone housing 401.

Still referring to FIG. 6, the two digital output signals 505A, 505B provided to the signal combiner 1100A are initially collected into signal data buffers 1131 and 1132, respectively. It is worth noting that the signal data buffers 1131, 1132 are constructed to accept I²S formatted serial digital input signals in the exemplary embodiment. The data output 1191, 1192 from the data buffers 1131, 1132 are compared by the data fitting block 1302 to compute a gain, offset, ramp parameter and accuracy of fit parameter 1342. Optionally, additional parameters may also be computed as described in U.S. Pat. No. 9,654,134 B2. The contents of the data buffer 1132 for the second channel is processed by the translation block 1402 to produce a matched frame data block 1182. The outputs of data blocks 1191 and 1182 are then weighted by window function blocks 1161 and 1162, respectively. Based on an accuracy of fit parameter 1342, a window packet combiner 1200 produces a single windowed section of combined data by selecting data based on the accuracy of fit parameter (e.g., $\varepsilon_{12}$) 1342 derived from the difference between the matched frames in the data fitting block 1302. The resultant (selected matched frame) may be combined with prior and subsequently selected window frames to produce a signal combiner output stream 1104 that is suppled as the input to a serial converter block 1201 that provides a serial data output stream representing the optimally combined signal that originated from the two microphone elements 410 and 411.

Since (in this case) the internal signal combiner in FPGA 514 combines the dual digital data streams 505A, 505B (outputs of ADC1 504A and ADC2 504B) into a single stream 1104 this data may be converted by the internal FPGA 514 to serial format at block 1201 before being transmitted out over the physical cable 404. In this case, an external digital processor 513 may only need to receive the serial data for the combined output and convert it to some other more useful format, such as PCM data for creating a combined digital output signal 511. While it may be possible to generate the combined digital output signal 511 on an internal digital processor/FPGA 514, in most cases it will be more appropriate to transmit serial data over the cable 404 to an external device.

In other embodiments, it may be preferable to send the two digital signals 505A, 505B serially (e.g. in SPDIF format as disclosed in connection with FIG. 5) over the cable 404 to later combine them in an external FPGA 513 that contains a signal combiner within it.

CONCLUSION

The construction and arrangement of the elements of the systems and methods as shown in the exemplary (and alternative) embodiments are illustrative only, although only a few embodiments of the present disclosure have been described in detail.

Given the preceding disclosure, those skilled in the art who review this disclosure will readily appreciate that many modifications are possible without materially departing from the novel teachings and advantages of the subject matter disclosed. For example, mounting two condenser elements coincidently at the end of a single (single end) protrusion from a lavalier housing (as described earlier) helps to ensure both condenser elements are open to the sound environment when clipped to performer and will be exposed to the same acoustic energy. However, mounting microphone transducers to face different directions or spaced apart may be suitable, particularly if omnidirectional microphone transducers are used. Alternatively, a multi-pronged enclosure may be suitable wherein distinct microphone transducers are separately mounted at the end of differing prongs, if the distinct microphone transducers are exposed to identical or nearly acoustic energy.

The invention claimed is:

1. A microphone with improved dynamic range comprising:

a first microphone transducer element having a first sensitivity to acoustic pressure input and outputting a first voltage signal in response to acoustic pressure detected by the first microphone transducer element;

a second microphone transducer element having a second sensitivity to acoustic pressure input and outputting a second voltage signal in response to acoustic pressure by the second microphone transducer element; wherein the first sensitivity to acoustic pressure is greater than the second sensitivity to acoustic pressure;

means for amplifying and digitizing the first voltage signal to generate a first digital signal;

means for amplifying and digitizing the second voltage signal to generate a second digital signal;

an internal digital processor that receives the first digital signal and the second digital signal and outputs a digital audio output signal with improved signal to noise both at lower and higher input acoustic levels, said internal digital processor providing:

a first data buffer for storing frames of data for the first digital signal, and a second data buffer for storing frames of data for the second digital signal, means for applying a window function that overlaps in time to the frames of data to generate windowed data packets corresponding to each of the first and the second microphone transducer elements, and a combiner configured to select a windowed data packet for one of the microphone transducer elements and sequentially combine the selected data packets to construct the digital audio output signal; and means for providing DC power to the internal digital processor, the first microphone transducer element, the second microphone transducer element, means for amplifying and digitizing the first voltage signal and means for amplifying and digitizing the second voltage signal;

wherein the first and second microphone transducer elements, said means for amplifying and digitizing the first voltage signal to generate a first digital signal, said means for amplifying and digitizing the second voltage signal to generate a second digital signal, and the internal digital processor are located within a common housing or attached housings.

2. The microphone with improved dynamic range recited in claim 1 wherein the first microphone transducer and the second microphone transducer are placed coincidently in order to be exposed to nearly identical acoustic energy.

3. The microphone with improved dynamic range recited in claim 2 wherein the first and second microphone transducers are condenser-type transducers and the distance between the center of a diaphragm of the first microphone transducer and the center of a diaphragm of the second microphone transducer is not greater than 1.7 cm.

4. The microphone with improved dynamic range recited in claim 1 wherein the microphone is a lavalier microphone, and at least one clip is provided to attach the lavalier microphone to clothing worn by a person or in the hair of a person.

5. The microphone with improved dynamic range recited in claim 1 wherein the combiner is configured to select windowed data packets corresponding to the first microphone transducer element if an accuracy of fit threshold is met and to select windowed data packets corresponding to the second microphone transducer element if an accuracy of fit threshold is not met.

6. The microphone with improved dynamic range recited in claim 1 wherein the digital audio output signal is converted to a stereo serial data stream in SPDIF (Sony Philips Digital Interface) format, and the microphone further comprises a wire and the stereo serial data stream in SPDIF format is transmitted over the wire from the internal digital signal processor to a wireless transmitter unit.

7. The microphone with improved dynamic range recited in claim 1 wherein the internal digital processor is a field programmable gate array.

8. The microphone with improved dynamic range recited in claim 1 wherein the microphone has a cord with a conductor that transmits a clock signal (WCLK) superimposed on underlying DC power, a capacitor that functions to separate the clock signal from the underlying DC power transmitted over the conductor to provide the clock signal to the internal digital processor and the underlying DC power to a linear regulator, said linear regulator and said capacitor being located in the housing or attached housings, and said linear regulator providing DC power to the internal digital processor and to the means for amplifying and digitizing the first voltage signal and means for amplifying and digitizing the second voltage signal, and providing biasing voltage to the first microphone transducer element and to the second microphone transducer element.

9. The microphone with improved dynamic range recited in claim 1 wherein the internal digital processor further provides translation means for matching data from the first data buffer and data from the second data buffer prior to the application of the window function.

10. The microphone with improved dynamic range recited in claim 9 wherein the translation means includes the operations of at least one of scaling, adding a DC offset, adjusting a slope or delaying, and wherein the translation means operates on a basis of minimizing the sum of squares for the error between a data buffer and translated data buffer.

11. The microphone with improved dynamic range recited in claim 1 wherein the sum of sequential window functions is unity.

12. The microphone with improved dynamic range recited in claim 1 wherein at least one of the first digital signal and the second digital signal are equalized by digital processing.

13. A method of generating a digital audio output signal with improved signal to noise both at lower and higher input acoustic levels comprising the steps of:

providing a first microphone transducer element having a first sensitivity to acoustic pressure input;

providing a second microphone transducer element having a second sensitivity to acoustic pressure input, wherein the first sensitivity to acoustic pressure is greater than the second sensitivity to acoustic pressure;

providing a first impedance converter having a first junction field-effect transistor (JFET);

providing a second impedance converter having a second junction field-effect transistor (JFET);

providing a first pre-amplifier and a second pre-amplifier;

providing a first analog to digital converter and a second analog to digital converter;

providing an internal digital processor, wherein the first and second microphone transducer elements, the first and second impedance converters, the first and second pre-amplifiers, the first and second analog-to-digital converters and the internal digital processor are located within a common housing or attached housings;

supplying a biasing voltage to the first microphone transducer element and outputting a first low voltage signal in response to acoustic pressure detected by the first microphone transducer element;

supplying a biasing voltage to the second microphone transducer element outputting a second low voltage signal in response to acoustic pressure by the second microphone transducer element;

inputting the first low voltage signal to the first impedance converter and outputting a first amplified, low impedance voltage signal from the impedance converter;

inputting the second low voltage signal to the second impedance converter and outputting the second amplified, low impedance voltage signal from the impedance converter;

inputting the first amplified, low impedance voltage signal to the first preamplifier and outputting a first amplified voltage signal;

inputting the second amplified, low impedance voltage signal to the second preamplifier and outputting a second amplified voltage signal;

inputting the first amplified voltage signal into the first analog-to-digital converter to generate a first digital signal;

inputting the second amplified voltage signal into the second analog-to-digital converter to generate a second digital signal;

inputting the first digital signal and the second digital signal to the internal digital processor; and combining the first and second digital signals or signals derived from the first and second digital signals to generate a digital audio output signal with improved signal to noise both at lower and higher input acoustic levels.

14. The method of claim 13 wherein the internal digital processor generates a stereo serial data stream in SPDIF (Sony Philips Digital Interface) format from the first and the second digital signals; and the method further comprises transmitting the stereo serial data stream in SPDIF (Sony Philips Digital Interface) format to an external digital processor which in turn is used to generate the digital audio output signal with improved signal to noise both at lower and higher input acoustic levels.

15. The method of claim 13 wherein the digital audio output signal is generated within a wireless RF transceiver, an RF receiver, or a mixer recorder.

16. The method of claim 13 further comprising the steps providing an external digital processor, transmitting a clock signal over a cord to the internal digital processor, streaming serial data representing the first and second digital signals over the cord from the internal digital processor to the external digital processor, and implementing the combining step on the external digital processor.

17. The method as recited in claim 13 further comprises the step of providing a battery and an antenna for wireless communication within the common housing or attached housings and transmitting the digital audio output signal wirelessly over the antenna, wherein the step of combining the first and second digital signals or signals derived from the first and second digital signals to generate a digital audio output signal with improved signal to noise both at lower and higher input acoustic levels is implemented in the internal digital processor.

18. The method as recited in claim 13 further comprises the step of providing a battery and an antenna for wireless communication within the common housing or attached housings and transmitting the first and second digital signal in a serial data stream over the antenna, wherein the step of combining the first and second digital signals or signals derived from the first and second digital signals to generate a digital audio output signal with improved signal to noise both at lower and higher input acoustic levels is implemented in an external digital processor.

19. The method as recited in claim 13 wherein the first and second microphone transducers are condenser-type transducers.

20. The method as recited in claim 13 wherein the internal digital processor is a field programmable gate array.

21. The method as recited in claim 13 wherein the first microphone transducer and the second microphone transducer are placed coincidently in order to be exposed to nearly identical acoustic energy.

22. The method as recited in claim 13 wherein the first and second microphone transducers are condenser-type transducers and the distance between the center of a diaphragm of the first microphone transducer and the center of a diaphragm of the second microphone transducer is not greater than 1.7 cm.

23. The method as recited in claim 13 wherein the common housing or the attached housings are for a lavalier microphone, and method further comprises providing a clip on the lavalier microphone and using the clip to attach the lavalier microphone to clothing worn by a person or in the hair of a person.

* * * * *